United States Patent [19]

Takase et al.

[11] Patent Number: 5,294,837
[45] Date of Patent: Mar. 15, 1994

[54] SEMICONDUCTOR INTEGRATED CIRCUIT CAPABLE OF CORRECTING WIRING SKEW

[75] Inventors: Shinsuke Takase, Yokohama; Hisashi Hashimoto, Yokosuka, both of Japan

[73] Assignee: Kabushiki Kaisha Toshiba, Kawasaki, Japan

[21] Appl. No.: 978,046

[22] Filed: Nov. 18, 1992

Related U.S. Application Data

[63] Continuation of Ser. No. 765,837, Sep. 26, 1991, abandoned.

[30] Foreign Application Priority Data

Sep. 28, 1990 [JP] Japan .................. 2-259085

[51] Int. Cl.5 ............... H01L 23/48; H01L 29/44
[52] U.S. Cl. ............................ 257/774; 257/776; 257/781; 257/758
[58] Field of Search ............. 357/71, 68; 257/758, 257/750, 774, 773, 776

[56] References Cited

U.S. PATENT DOCUMENTS

| | | | |
|---|---|---|---|
| 4,587,549 | 5/1986 | Ushika | 357/68 |
| 4,916,521 | 4/1990 | Yoshikawa et al. | 357/68 |
| 4,924,290 | 5/1990 | Enkaku et al. | 357/68 |
| 5,025,303 | 6/1991 | Brighton | 357/68 |
| 5,034,799 | 7/1991 | Tomita et al. | 357/68 |
| 5,083,188 | 1/1992 | Yamagata | 357/71 |
| 5,117,280 | 5/1992 | Adachi | 357/71 |

FOREIGN PATENT DOCUMENTS

54-101282 8/1979 Japan .

*Primary Examiner*—Eugene R. LaRoche
*Assistant Examiner*—Viet Q. Nguyen
*Attorney, Agent, or Firm*—Finnegan, Henderson, Farabow, Garrett & Dunner

[57] ABSTRACT

A plurality of standard cells are placed on a semiconductor substrate. A first aluminum wiring layer is connected to those standard cells. Below the first aluminum wiring layer, a second wiring layer is formed which is not connected to the standard cells and which, together with the first wiring layer, forms a capacitor. Between the first and second aluminum wiring layers, an insulating layer is formed. Wiring skew is adjusted by making through-holes in the insulating layer, and connecting the first and second aluminum wiring layers to each other via as many through-holes as required to vary the capacitance between them.

27 Claims, 8 Drawing Sheets

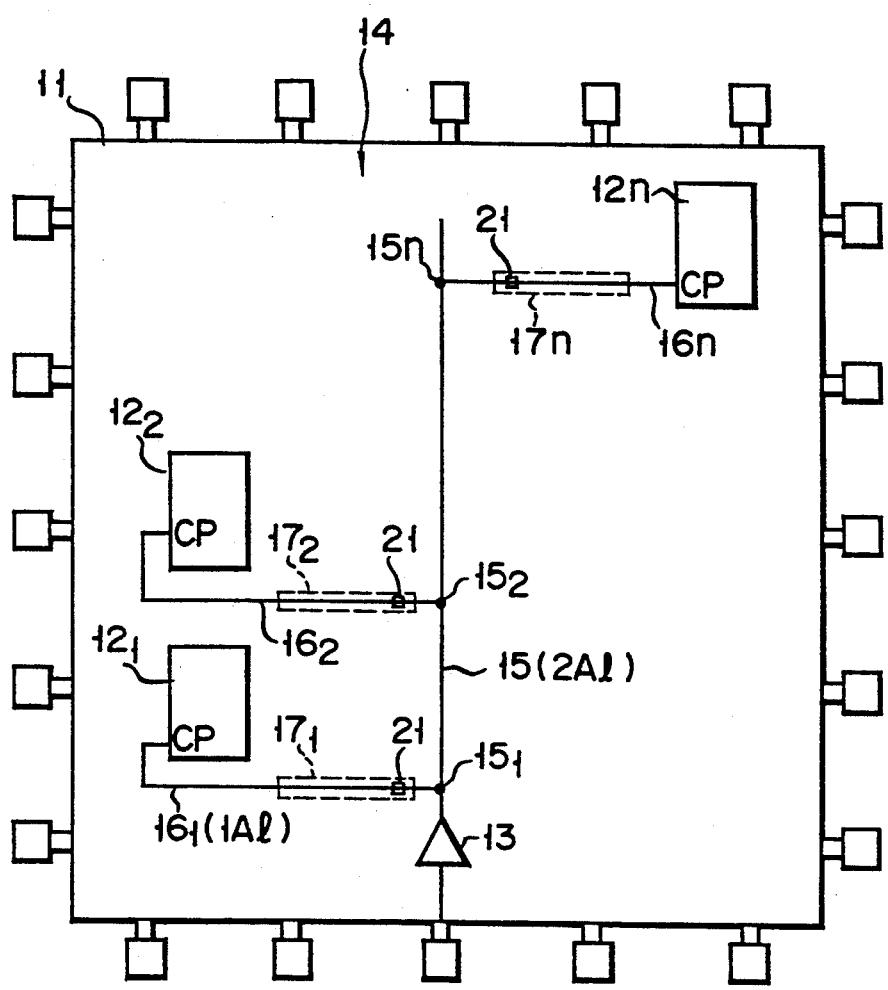
F I G. 1

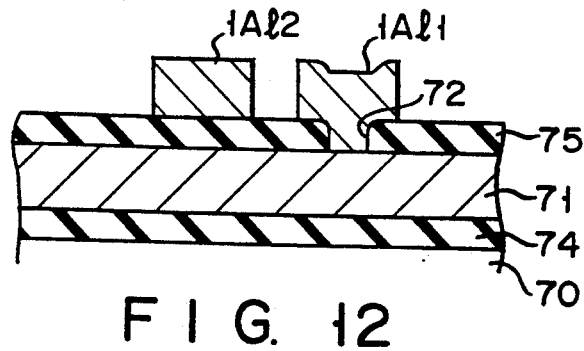
F I G. 12
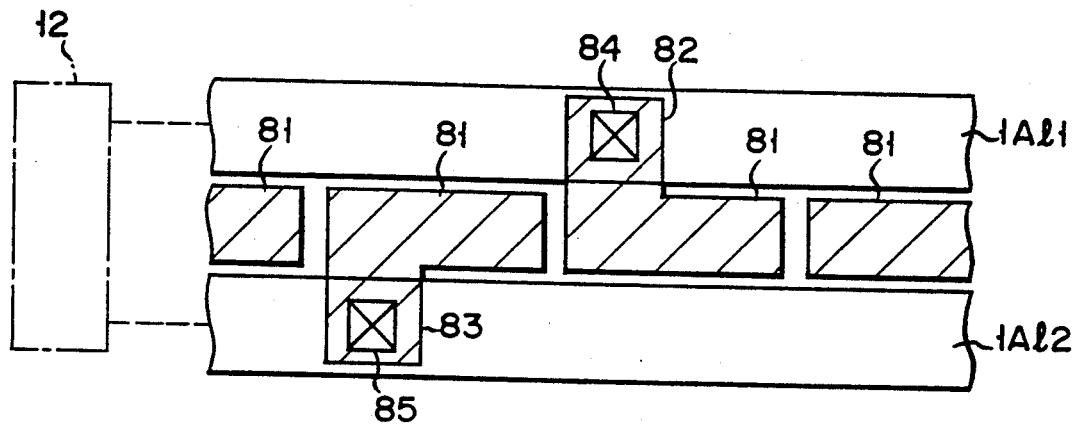
F I G. 13
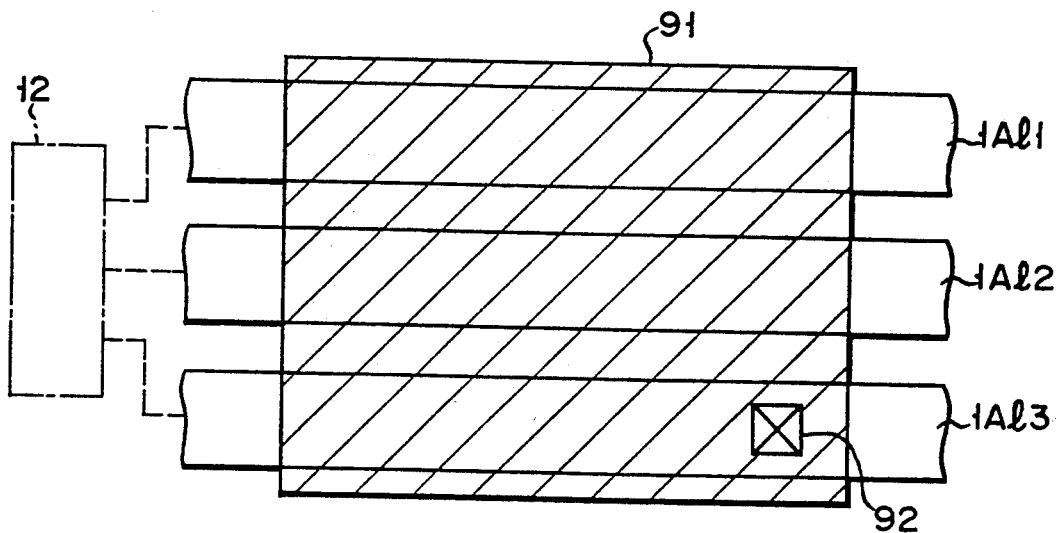
F I G. 14

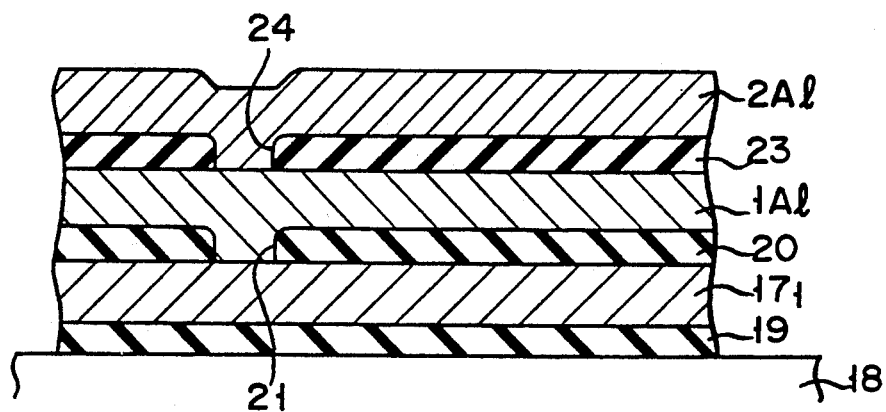
F I G. 18

SEMICONDUCTOR INTEGRATED CIRCUIT CAPABLE OF CORRECTING WIRING SKEW

This application is a continuation of application Ser. No. 07/765,837, filed Sep. 26, 1991, now abandoned.

BACKGROUND OF THE INVENTION

Field of the Invention

This invention relates to a semiconductor integrated circuit chip employing, for example, multilayer interconnection techniques, and more particularly to a semiconductor integrated circuit whose interconnection layout and wiring are automatically done by the standard cell method.

Description of the Related Art

FIG. 19 shows a layout of a chip on which logic circuits are placed by the standard cell method. On the chip 11, there are various logic circuits $11_1$ and $11_2$, a ROM $11_3$, and a RAM $11_4$. Between these logic circuits $11_1$ through $11_4$, a wiring region $11_5$ is provided, in which interconnections are formed to connect the logic circuits $11_1$ through $11_4$ to each other.

FIG. 20 illustrates the layout of FIG. 19 more specifically. On the chip 11, logic circuits $12_1$ through $12_n$ each composed of, for example, a flip flop circuit are placed together with a buffer circuit 13. Between the logic circuits $12_1$ through $12_n$ and buffer circuit 13, a wiring region 14 is provided, in which the output interconnection 15 of the buffer circuit 13 is made. The output interconnection 15 is composed of, for example, a second aluminum wiring layer 2Al and carries the signal from the buffer circuit 13, such as a clock signal. Each of nodes $15_1$ through $15_n$ in the output interconnection 15 is connected to one end of each of branch interconnections $16_1$ through $16_n$, respectively, the other end of which is connected to, for example, the clock input terminal CP of each of the logic circuits $12_1$ through $12_n$, respectively. These branch interconnections $16_1$ through $16_n$ are composed of a layer below the second aluminum wiring layer 2Al, such as a first aluminum wiring layer 1Al. Provided between the first and second aluminum wiring layers is an oxide film (not shown), in which through-holes (not shown) are made at places corresponding to the nodes $15_1$ through $15_n$. The branch interconnections $16_1$ through $16_n$ are connected to the output interconnection 15 via those through-holes.

Where the wiring lengths from the buffer circuit 13 to the individual logic circuits $12_1$ through $12_n$ differ from each other, the propagation time between them varies accordingly. The difference in the propagation time between the interconnections is called wiring skew or signal skew.

Normally, such wiring skew is corrected by adjusting the wiring length or changing the wiring path to control the wiring capacitance. The skew correction is performed in, for example, the simulation stage of the designed circuitry, or on the basis of the evaluation of produced samples.

In correcting a skew, a larger wiring length requires a more wiring area, resulting in an increase in the chip size. In addition, it is troublesome to correct the once-determined wiring by automatic interconnection layout and wiring. For this reason, it has been a common practice to manually correct the wiring whenever necessary. Such manual wiring correction makes automatic wiring meaningless and involves longer time for development of products.

SUMMARY OF THE INVENTION

The object of the present invention is to provide a semiconductor integrated circuit capable of reducing wiring skew with no change in the chip size by allowing the control of the wiring capacitance of only a particular interconnection without changing wiring paths and length in the chip after automatic interconnection layout and wiring have been done.

The foregoing object is accomplished by a semiconductor integrated circuit comprising: a plurality of circuit blocks placed on a semiconductor substrate; a first wiring layer connected to those circuit blocks; a second wiring layer which is placed at a different level from the first wiring layer to form a capacitor between them, and which is not connected to the circuit blocks an insulating layer placed between those first and second wiring layers; and through-holes made in the insulating layer, the first and second wiring layers being connected to each other via these through-holes.

With this invention, it is possible to control the wiring capacitance by forming the second wiring layer below or above the first wiring layer to form a capacitor between them, and connecting these first and second wiring layers to one another via through-holes in a suitable manner as required. Thus, wiring skew can be corrected without increasing the chip size.

In addition, the wiring capacitance can be adjusted easily by suitably changing the number of through-holes, which makes it possible to use automatic interconnection layout and wiring. This facilitates work.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic circuit diagram for first embodiment of the present invention;

FIG. 12 is a sectional side view taken along line 12—12 of FIG. 11;

FIG. 13 is a plan view for an important part of a seventh embodiment of the present invention;

FIG. 14 is a plan view for an important part of a eighth embodiment of the present invention;

FIG. 18 is a sectional side view for an important part of a twelfth embodiment of the present invention;

DETAILED DESCRIPTION OF THE PREFERRED EMBODIMENTS

Referring to the accompanying drawings, embodiments of the present invention will be explained.

Figure 20:
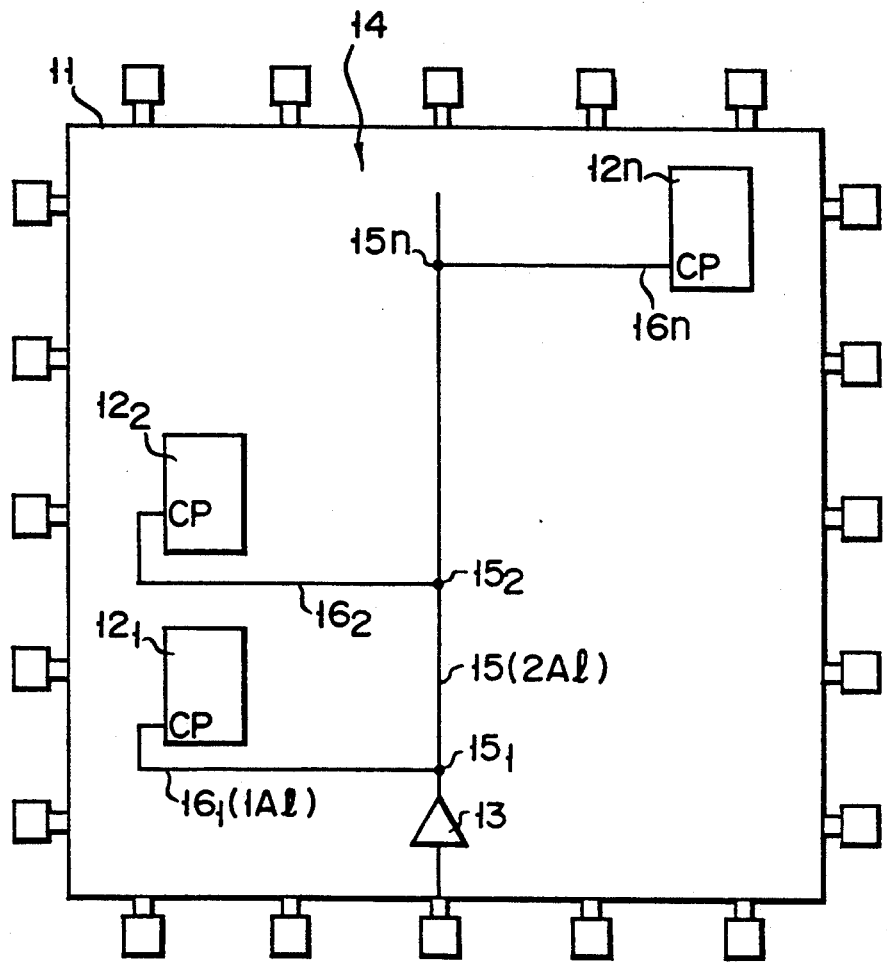
FIG. 20 is a plan view for a conventional semiconductor integrated circuit, illustrating FIG. 19 more specifically.

FIG. 1 shows a first embodiment of the present invention with the same parts as in FIG. 20 being indicated by the same reference characters.

In the figure, below branch interconnections $16_1$ through $16_n$ composed of a first aluminum wiring layer 1Al, polysilicon layers $17_1$ through $17_n$ are formed, for example. Between these polysilicon layers $17_1$ through $17_n$ and branch interconnections $16_1$ through $16_n$, an oxide film (not shown) is formed. The polysilicon layers $17_1$ through $17_n$, together with the branch interconnections $16_1$ through $16_n$, form capacitors rather than transmit signals, so that both ends of each of the polysilicon layers $17_1$ through $17_n$ are connected to no circuit at all.

Figure 2:
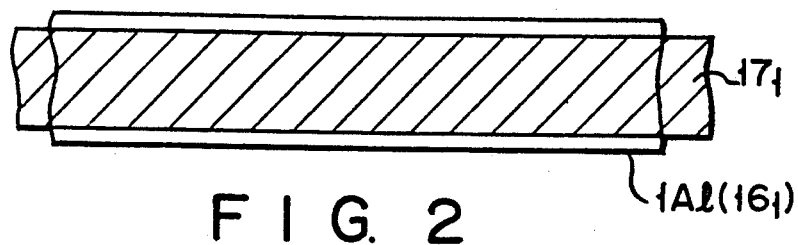
FIG. 2 is a plan view for an important part of FIG. 1.
Figure 3:
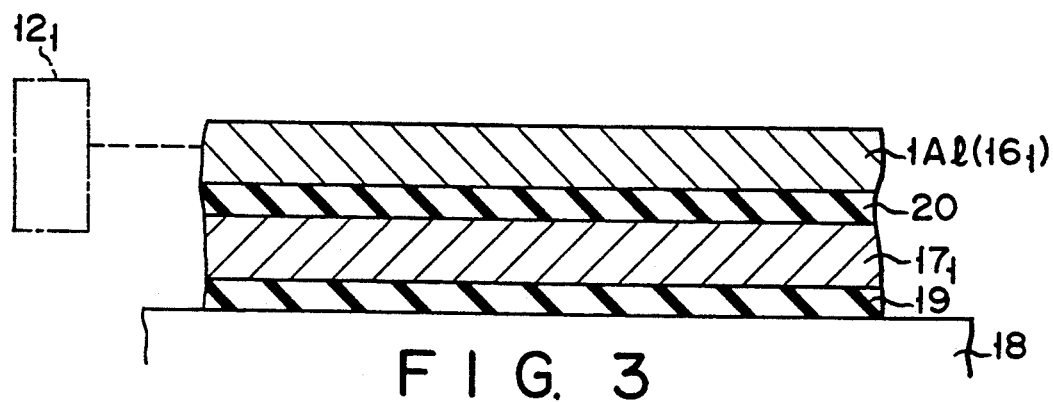
FIG. 3 is a sectional side view for an important part of FIG. 1.

FIGS. 2 and 3 illustrate a part of the branch interconnection $16_1$. On the surface of a semiconductor substrate 18, an oxide film 19 is formed, on which the polysilicon layer $17_1$ is formed. On the polysilicon layer $17_1$, an oxide film 20 is formed, on which the branch interconnection $16_1$ made up of the first aluminum wiring layer 1Al is provided. These branch interconnection $16_1$ and polysilicon layer $17_1$ are connected to each other via a through-hole 21 made in the oxide film 20 at a specified place.

When the branch interconnection $16_1$ and polysilicon layer $17_1$ are not connected to each other, propagation delay of signal takes place due to only the capacitance between the branch interconnection $16_1$ and the semiconductor substrate 18. However, when the branch interconnection $16_1$ and polysilicon layer $17_1$ are connected to each other via the through-hole 21, the capacitance between the polysilicon layer $17_1$ and the semiconductor substrate 18 is added to the capacitance between the branch interconnection $16_1$ and the semiconductor substrate 18. This increase the propagation delay of the signal passing through the branch interconnection $16_1$. More than one through-hole 21 may be provided and the propagation delay can be controlled by suitably selecting the number of through-holes 21.

With this arrangement where the polysilicon layer $17_1$ is formed below the branch interconnection $16_1$ with the former being connected to the latter via one or more through-holes 21, skew wiring is adjusted by suitably setting the number of through-holes 21. If wiring skew is found by circuit simulation after automatic interconnection layout and wiring, the skew is easily corrected by making as many through-holes as required in the mask pattern. This allows easy correction of wiring skew by automatic interconnection layout and wiring, thereby shortening the time required for design and manufacturing.

Furthermore, in the embodiment, since the wiring length and paths are not changed at all and the polysilicon layer $17_1$ is located below the first aluminum wiring layer 1Al, this prevents an increase in the chip size. Hereinafter, other embodiments will be explained.

Figure 6:
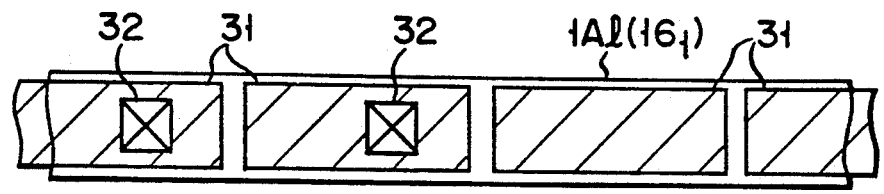
FIG. 6 is a plan view for an important part of a second embodiment of the present invention.

FIG. 6 shows a second embodiment of the present invention with the same parts as in the first embodiment being indicated by the same reference characters.

In this embodiment, below the branch interconnection $16_1$ composed of the first aluminum wiring layer 1Al, subdivided polysilicon layers 31 are located along the branch interconnection $16_1$. Between these polysilicon layers 31 and branch interconnection $16_1$, an oxide film (not shown) is formed, in which through-holes 32 are made. The branch interconnection $16_1$ is connected suitably to the polysilicon layers 31 via the through-holes 32.

With this embodiment, the wiring capacitance can be adjusted by, for example, varying the number of polysilicon layers 31 connected to the branch interconnection $16_1$. Thus, once the propagation delay is determined for one polysilicon layer 31 connected to the interconnection, then wiring skew can be corrected accurately by suitably selecting the number of polysilicon layers 31 connected to the interconnection according to the delay time of the signal.

Figure 7:
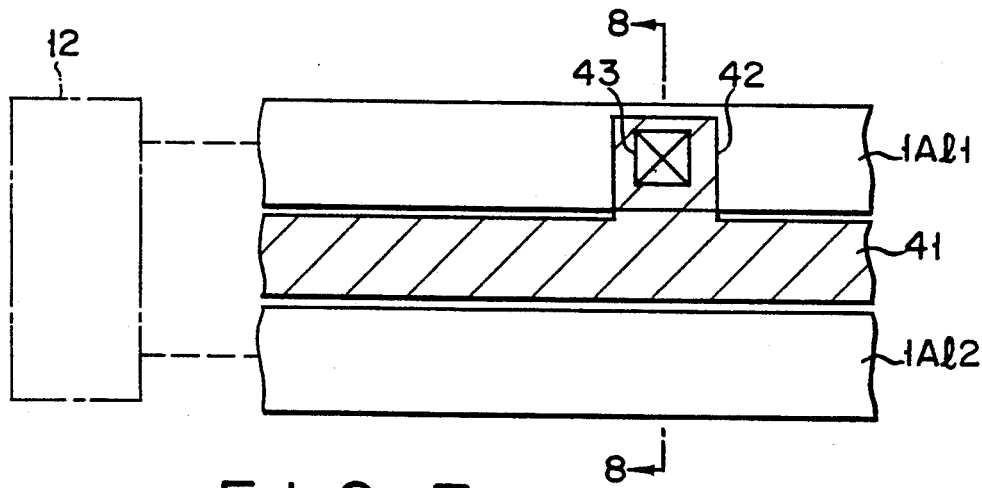
FIG. 7 is a plan view for an important part of a third embodiment of the present invention.
Figure 8:
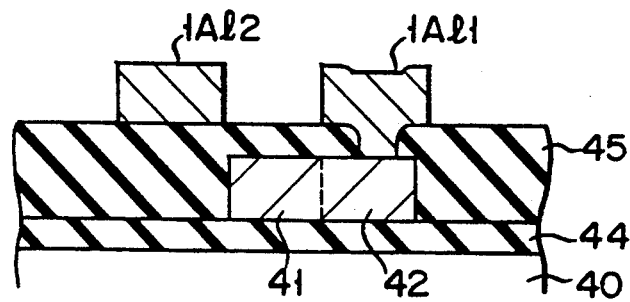
FIG. 8 is a sectional side view taken along line 8—8 of FIG. 7.

FIGS. 7 and 8 illustrate a third embodiment of the present invention.

In FIGS. 7 and 8, on a semiconductor substrate 40, an oxide film 44 is formed, on which a polysilicon layer 41 is formed. On one side of the polysilicon layer 41, a contact portion 42 is provided. An oxide film 45 is formed on the polysilicon layer 41, contact portion 45, and oxide film 44. On the oxide film 45, a first aluminum wiring layers $1Al_1$ and $1Al_2$ connected to, for example, to the logic circuit 12 are formed with the first aluminum wiring layer $1Al_1$ located above the contact portion 42. The polysilicon layer 41, when viewed from the top as in FIG. 7, is located between the first aluminum layers $1Al_1$ and $1Al_2$. In the oxide film 45, a through-hole 43 is made corresponding to the contact portion 42. The contact portion 42 is connected to the first aluminum wiring layer $1Al_1$ via the through-hole 43. This configuration also has the same effect as with the first embodiment.

The polysilicon layer 41, as shown in FIG. 7, is provided between the first aluminum wiring layers $1Al_1$ and $1Al_2$, which are previously formed in the wiring regions, being separated by the width of the polysilicon layer 41. As a result, the existence of the silicon layer 41 results in no increase in the chip size.

Figure 9:
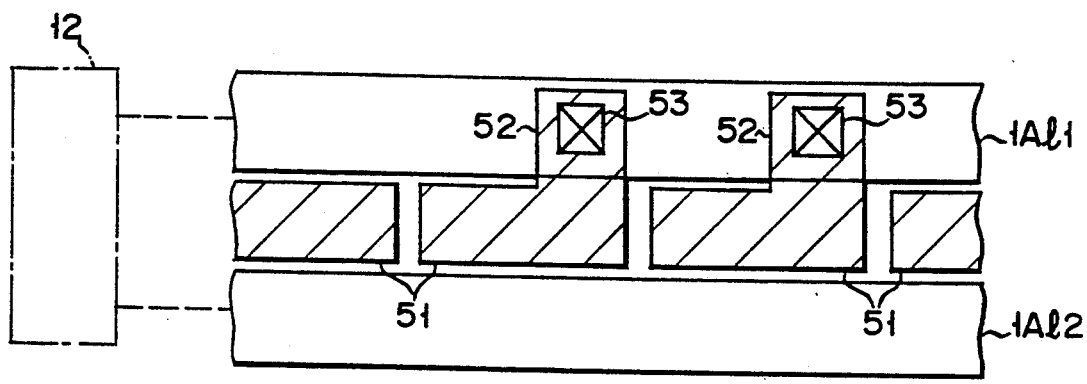
FIG. 9 is a plan view for an important part of a fourth embodiment of the present invention.

FIG. 9 shows a fourth embodiment of the present invention, which is a modification of the embodiment shown in FIGS. 7 and 8.

In this embodiment, subdivided polysilicon layers 51 are formed between and below the first aluminum wiring layers $1Al_1$ and $1Al_2$. Each polysilicon layer 51 is provided with a contact portion 52 that is below the first aluminum wiring layer $1Al_1$.

With this arrangement, it is possible to accurately correct wiring skew by suitably connect the contact portions 52 to the first aluminum wiring layer $1Al_1$ through as many through-holes 53 as required.

Figure 10:
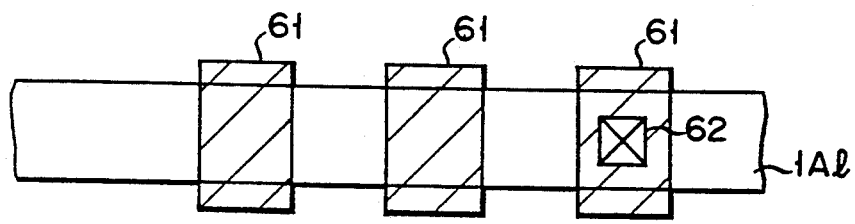
FIG. 10 is a plan view for an important part of a fifth embodiment of the present invention

FIG. 10 shows fifth embodiment of the present invention.

In this embodiment, below the first aluminum wiring layer 1Al, subdivided polysilicon layers 61 are formed so as to cross the first aluminum wiring layer 1Al. With this configuration, the polysilicon layers 61 are connected to the first aluminum wiring layer 1Al via as many through-holes 62 in the oxide film (now shown) as needed.

Figure 11:
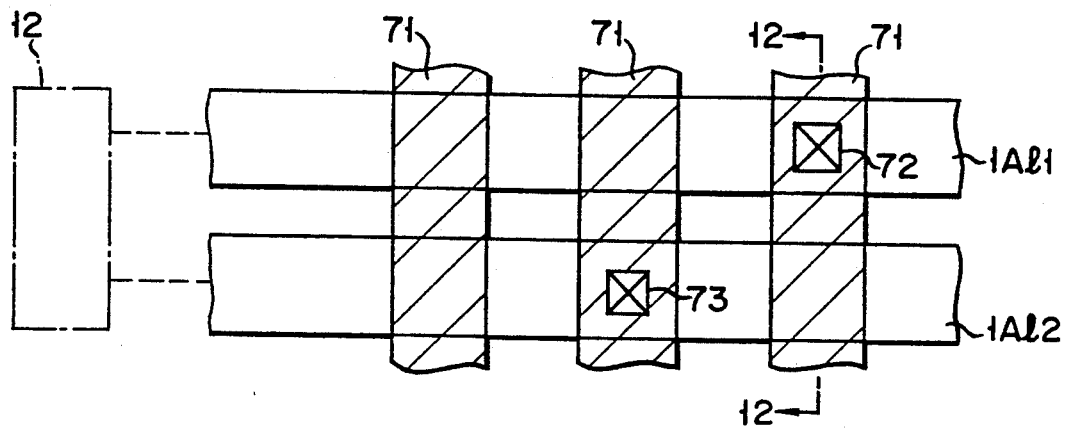
FIG. 11 is a plan view for an important part of a sixth embodiment of the present invention.

FIGS. 11 and 12 show a sixth embodiment of the present invention, which is a modification of the embodiment shown in FIG. 10.

In FIGS. 11 and 12, on a semiconductor substrate 70, an oxide film 74 is formed, on which polysilicon layers 71 are formed, being spaced at regular intervals. An oxide film 75 is formed on and above the polysilicon layers 71 and semiconductor substrate 70. On the oxide film 75, the first aluminum wiring layers $1Al_1$ and $1Al_2$ are formed so as to cross the polysilicon layers 71.

With this configuration, through-holes 72 are made in the oxide film 75 at places where the polysilicon layers 71 cross the first aluminum wiring layer $1Al_1$, while through-holes 73 are made in the oxide film 75 at places where the polysilicon layer 71 cross the first aluminum wiring layer $1Al_2$. The first aluminum wiring layers $1Al_1$ and $1Al_2$ are connected to the polysilicon layers 71 via these through-holes 72 and 73 With this embodiment, wiring skew can be corrected as in the above embodiments.

FIG. 13 is a seventh embodiment of the present invention, which is a modification of the embodiment of FIG. 9.

In this embodiment, subdivided polysilicon layers 81 are formed between and below the first aluminum wiring layers $1Al_1$ and $1Al_2$ arranged in parallel. A part of the polysilicon layer 81 serves as a contact portion 82 below the first aluminum wiring layer $1Al_1$, while a part of the polysilicon layer 81 serves as a contact portion 83 below the first aluminum wiring layer $1Al_2$. The contact portion 82 is connected to the first aluminum wiring layer $1Al_1$ via a through-hole 84, whereas the contact portion 83 is connected to the first aluminum wiring layer $1Al_2$ via a through-hole 85.

With this embodiment, use of the polysilicon layers 81 enables correction of wiring skew in the first aluminum wiring layers $1Al_1$ and $1Al_2$.

FIG. 14 is an eighth embodiment of the present invention, which is a modification of the embodiment of FIG. 11 and has almost the same sectional structure as in FIG. 12.

In this embodiment, below the first aluminum wiring layers $1Al_1$, $1Al_2$, and $1Al_3$ arranged in parallel, a polysilicon layer 91 is formed which has an area covering specified portions of the first aluminum wiring layers $1Al_1$, $1Al_2$, and $1Al_3$. Between the polysilicon layer 91 and the first aluminum wiring layers $1Al_1$, $1Al_2$, and $1Al_3$, an oxide film is formed, in which a through-hole 92 is made. The polysilicon layer 91 is connected to the first aluminum wiring layer $1Al_3$ via the through-hole 92.

With this configuration, by making as many through-holes 92 as required at suitable places, and connecting the polysilicon layer 91 to the first aluminum wiring layer $1Al_1$, $1Al_2$, or $1Al_3$, it is possible to allow the single polysilicon layer 91 to correct wiring skew in the first aluminum wiring layers $1Al_1$, $1Al_2$, or $1Al_3$.

While in the first through eighth embodiments, a polysilicon layer is formed below the first aluminum wiring layer 1Al, it may be formed in other places, for example, above the first aluminum wiring layer.

Further, in the first through eighth embodiments, the wiring capacitance of the first aluminum wiring layer is adjusted by using a polysilicon layer, but the present invention is not restricted to this. For example, use of a second aluminum wiring layer above the first aluminum wiring layer may provide adjustment of the wiring capacitance.

Figure 4:
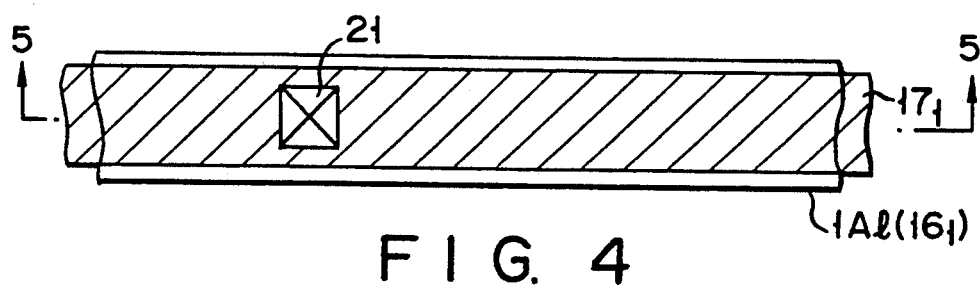
FIG. 4 is a plan view for explaining skew correction using FIGS. 2 and 3.
Figure 5:
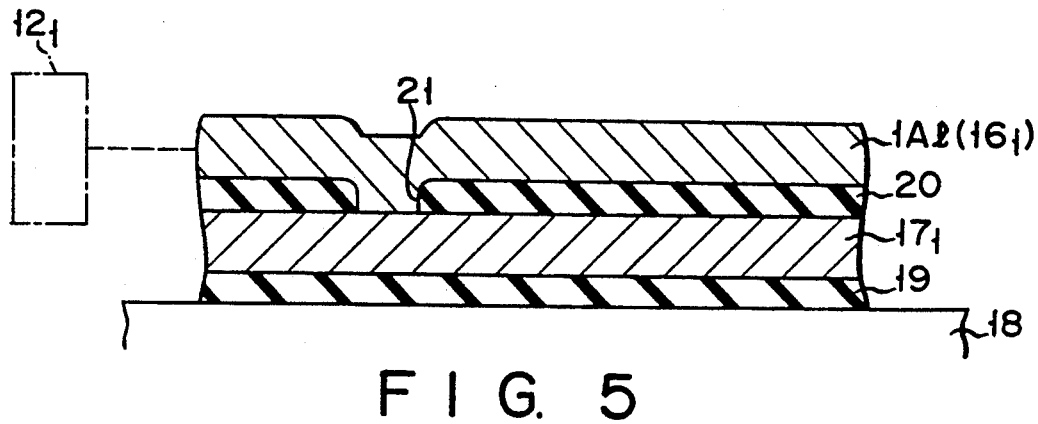
FIG. 5 is a sectional side view taken along line 5—5 of FIG. 4.
Figure 15:
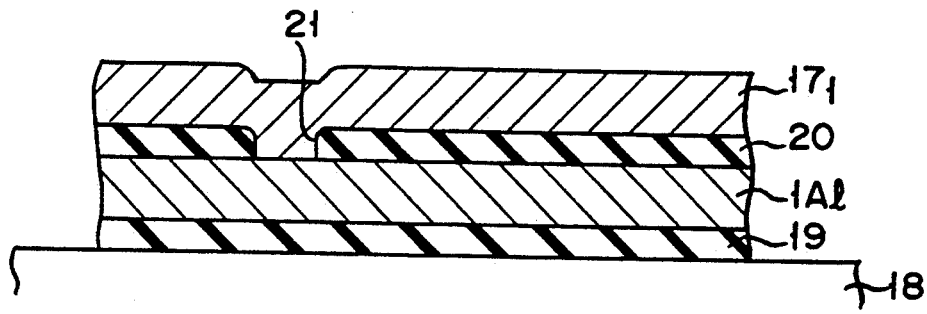
FIG. 15 is a sectional side view for an important part of a ninth embodiment of the present invention.

FIG. 15 is a ninth embodiment of the present invention, which is a modification of the embodiment of FIGS. 4 and 5. In this embodiment, a polysilicon layer $17_1$ is formed above the first aluminum wiring layer 1Al. This polysilicon layer $17_1$ may be replaced by a second aluminum wiring layer 2Al. In FIG. 15, the same parts as in FIGS. 4 and 5 are indicated by the same reference characters.

Figure 16:
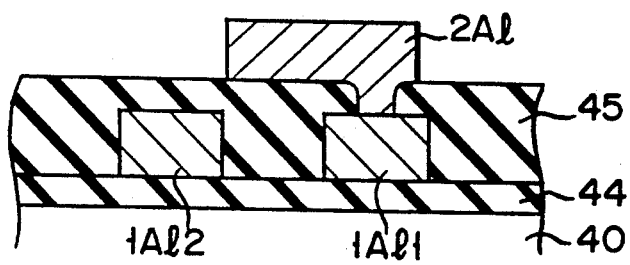
FIG. 16 is a sectional side view for an important part of a tenth embodiment of the present invention.

FIG. 16 shows a tenth embodiment of the present invention, where the structure shown in FIGS. 7 and 8 is achieved with the first and second aluminum wiring layers 1Al and 2Al. In FIG. 16, the same parts as in FIGS. 7 and 8 are indicated by the same reference characters.

Figure 17:
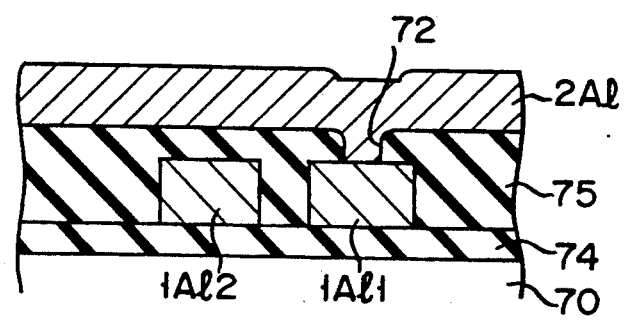
FIG. 17 is a sectional side view for an important part of a eleventh embodiment of the present invention.
Figure 19:
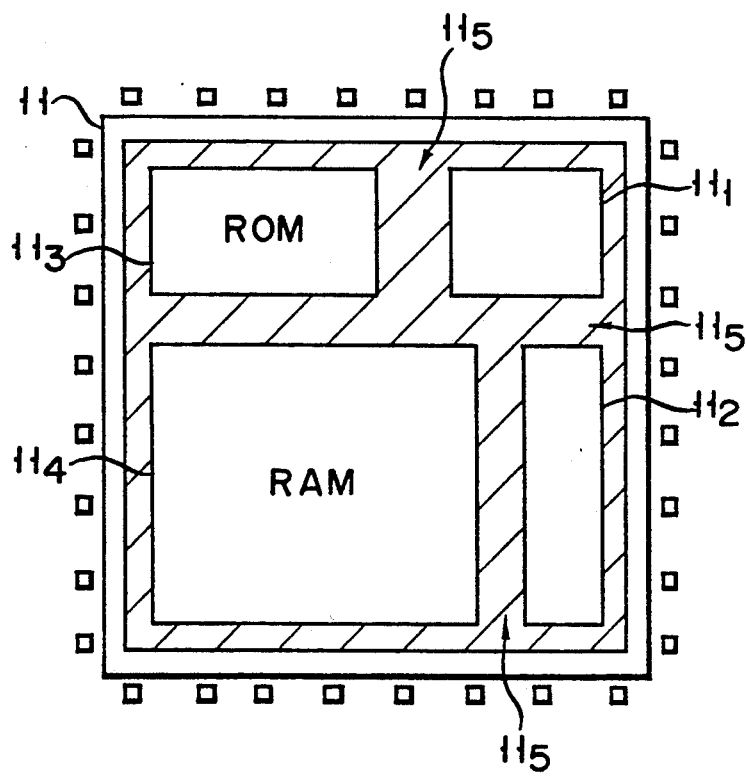
FIG. 19 is a plan view for a conventional semiconductor integrated circuit made by the standard cell method.

FIG. 17 shows an eleventh embodiment of the present invention, where the structure shown in FIG. 11 is achieved with the first and second aluminum wiring layers 1Al and 2Al. In FIG. 17, the same parts as in FIGS. 11 and 12 are indicated by the same reference characters.

FIG. 18 shows a twelfth embodiment of the present invention, which is a modification of the structure of FIG. 5. In FIG. 18, the same parts as in FIG. 5 are indicated by the same reference characters and explanation will be given about only the different parts.

On the first aluminum wiring layer 1Al, an oxide film 23 is formed, on which the second aluminum wiring layer 2Al is formed. In the oxide film 23, through-holes 24 are made, via which the first and second aluminum wiring layers 1Al and 2Al are connected to each other. With this embodiment, wiring skew in the first and second aluminum wiring layers 1Al and 2Al can be corrected as explained in the above embodiments.

This invention may be practiced and embodied in still other ways without departing from the spirit or essential character thereof.

What is claimed is:

1. A semiconductor integrated circuit comprising:
    a plurality of circuit blocks placed on a semiconductor substrate;
    a first wiring layer disposed above the semiconductor substrate and being unconnected to said circuit blocks;
    a second wiring layer disposed at a different level from said first wiring layer to form a wiring capacitance between said first and second wiring layers, and being connected to said circuit blocks; and
    an insulating layer disposed between said first and second wiring layers and including through-hole passages formed in said insulating layer, said first and second wiring layers being connected to each other via the through-hole passages to allow adjustment of the wiring capacitance.

2. A semiconductor integrated circuit according to claim 1, wherein said insulating layer is formed on said second wiring layer and said first wiring layer is formed on said insulating layer.

3. A semiconductor integrated circuit according to claim 1, wherein said insulating layer is formed on said first wiring layer and said second wiring layer is formed on said insulating layer.

4. A semiconductor integrated circuit according to claim 2, wherein said first wiring layer is made of aluminum and said second wiring layer is made of polysilicon.

5. A semiconductor integrated circuit according to claim 3, wherein said first wiring layer is made of aluminum and said second wiring layer is made of polysilicon.

6. A semiconductor integrated circuit according to claim 3, wherein said first and second wiring layers are made of aluminum.

7. A semiconductor integrated circuit comprising:
a plurality of circuit blocks placed on a semiconductor substrate;
a plurality of first wiring layers being unconnected to said circuit blocks and spaced at regular intervals;
a second wiring layer disposed at a different level from and between said first wiring layers to form wiring capacitance between the second and first wiring layers, and which has contact portions overlapping said first wiring layers and is connected to said circuit blocks;
an insulating layer disposed between said first and second wiring layers and including a through-hole passage formed in the insulating layer at locations corresponding to said contact portions, said first and second wiring layers being connected to each other via the through-hole passage to allow adjustment of the wiring capacitance.

8. A semiconductor integrated circuit according to claim 7, wherein said insulating layer is formed on said second wiring layer and said first wiring layers are formed on said insulating layer.

9. A semiconductor integrated circuit according to claim 7, wherein said insulating layer is formed on said first wiring layers and said second wiring layer is formed on said insulating layer.

10. A semiconductor integrated circuit according to claim 8, wherein said first wiring layers are made of aluminum and said second wiring layer is made of polysilicon.

11. A semiconductor integrated circuit according to claim 9, wherein said first wiring layers are made of aluminum and said second wiring layer is made of polysilicon.

12. A semiconductor integrated circuit according to claim 9, wherein said first and second wiring layers are made of aluminum.

13. A semiconductor integrated circuit comprising:
a plurality of circuit blocks placed on a semiconductor substrate;
a plurality of first wiring layers being unconnected to said circuit blocks and spaced at regular intervals;
a second wiring layer disposed so as to cross said first wiring layers at right angles to form a wiring capacitance between the second and first wiring layers, and which is connected to said circuit blocks;
an insulating layer disposed between said first and second wiring layers and including through-hole passages formed in said insulating layer, said first and second wiring layers being connected to each other via the through-hole passages to allow adjustment of the wiring capacitance.

14. A semiconductor integrated circuit according to claim 13, wherein said insulating layer is formed on said second wiring layer and said first wiring layers are formed on said insulating layer.

15. A semiconductor integrated circuit according to claim 13, wherein said insulating layer is formed on said first wiring layers and said second wiring layer is formed on said insulating layer.

16. A semiconductor integrated circuit according to claim 14, wherein said first wiring layers are made of aluminum and said second wiring layer is made of polysilicon.

17. A semiconductor integrated circuit according to claim 15, wherein said first wiring layers are made of aluminum and said second wiring layer is made of polysilicon.

18. A semiconductor integrated circuit according to claim 15, wherein said first and second wiring layers are made of aluminum.

19. A semiconductor integrated circuit comprising:
a plurality of circuit blocks placed on a semiconductor substrate;
a first wiring layer disposed above said semiconductor substrate and being unconnected to said circuit blocks;
a first insulating layer formed on said first wiring layer and including a plurality of first through-hole passages formed in said first insulating layer;
a second wiring layer formed on said first insulating layer and being connected to said circuit blocks, and which is connected to said first wiring layer via said first through-hole passages to allow adjustment of the wiring capacitance;
a second insulating layer formed on said second wiring layer and including second through-hole passages formed in said second insulating layer; and
a third wiring layer formed on said second insulating layer and being connected to said circuit blocks, and which is connected to said second wiring layer via said second through-hole passages to allow adjustment of the wiring capacitance.

20. A semiconductor integrated circuit according to claim 19, wherein said first wiring layer is made of polysilicon.

21. A semiconductor integrated circuit according to claim 19, wherein said second and third wiring layers are made of aluminum.

22. A semiconductor integrated circuit comprising:
a plurality of circuit blocks placed on a semiconductor substrate;
a subdivided first wiring layer formed above the semiconductor substrate and being unconnected to said circuit blocks;
a second wiring layer disposed at a different level from said first wiring layer to form a wiring capacitance between the first and second wiring layers, and being connected to said circuit blocks; and
an insulating layer disposed between said first and second wiring layers and including a plurality of through-hole passages formed in said insulating layer, said first and second wiring layers being connected to each other via the through-hole passages in accordance with a delay time of a signal transferred in the second wiring layer.

23. A semiconductor integrated circuit comprising:
a plurality of circuit blocks placed on a semiconductor substrate;
a plurality of branch interconnection layers formed above the semiconductor substrate, one end of each branch interconnection layer being connected to at least one of the circuit blocks;

a plurality of wiring layers disposed at a different level from the branch interconnection layers to form a wiring capacitance between the branch interconnection layers and the wiring layers, and being unconnected to the circuit blocks;

an insulating layer disposed between the branch interconnection layers and the wiring layers and including through-hole passages formed in said insulating layer, said branch interconnection layers and the wiring layers being connected to each other via the through-hole passages to allow adjustment of the wiring capacitance; and an interconnection layer being connected to another end of each of the branch interconnection layers.

24. A semiconductor integrated circuit according to claim 1, wherein:
   said first wiring layer is subdivided into a plurality of different sections;
   said second wiring layer comprises at least two signal paths having different timing delays; and
   said sections of said first wiring layer are selectively connected to said second wiring layer through said through-hole passages to reduce the difference between the timing delays for the at least two signal paths.

25. A semiconductor integrated circuit according to claim 7, wherein:
   each first wiring layer is subdivided into a plurality of different sections;
   said second wiring layer comprises at least two signal paths having different timing delays; and
   said sections of each first wiring layer are selectively connected to said second wiring layer through said through-hole passages to reduce the difference between the timing delays for the at least two signal paths.

26. A semiconductor integrated circuit according to claim 13, wherein:
   each first wiring layer is subdivided into a plurality of different sections;
   said second wiring layer comprises at least two signal paths having different timing delays; and
   said sections of each first wiring layer are selectively connected to said second wiring layer through said through-hole passages to reduce the difference between the timing delays for the at least two signal paths.

27. A semiconductor integrated circuit according to claim 22, wherein said first and second wiring layers are connected to each other via the through-hole passages to allow adjustment of the wiring capacitance.

* * * * *